United States Patent
Yang

(10) Patent No.: US 6,404,791 B1
(45) Date of Patent: Jun. 11, 2002

(54) PARALLEL CASCADE QUANTUM WELL LIGHT EMITTING DEVICE

(75) Inventor: Rui Q. Yang, Clarksville, MD (US)

(73) Assignee: Maxion Technologies, Inc., Hyattsville, MD (US)

( * ) Notice: Subject to any disclaimer, the term of this patent is extended or adjusted under 35 U.S.C. 154(b) by 0 days.

(21) Appl. No.: 09/680,317

(22) Filed: Oct. 6, 2000

Related U.S. Application Data

(60) Provisional application No. 60/158,403, filed on Oct. 7, 1999.

(51) Int. Cl.$^7$ ................................................ H01S 5/00
(52) U.S. Cl. ............................................ 372/45; 372/46
(58) Field of Search ..................... 372/43–46; 257/22, 257/97

(56) References Cited

U.S. PATENT DOCUMENTS

| | | | |
|---|---|---|---|
| 5,079,601 A | * | 1/1992 | Esaki et al. ..................... 357/4 |
| 5,457,709 A | | 10/1995 | Capasso et al. |
| 5,558,015 A | | 9/1996 | Yang |
| 5,799,026 A | | 8/1998 | Meyer et al. |
| 5,901,168 A | | 5/1999 | Baillargeon et al. |
| 5,936,989 A | | 8/1999 | Capasso et al. |
| 5,995,529 A | | 11/1999 | Kurtz et al. |
| 6,137,817 A | | 10/2000 | Baillargeon et al. |
| 6,144,681 A | | 11/2000 | Capasso et al. |

OTHER PUBLICATIONS

R. Yang and J. Xu, "Population Inversion Through Resonant Interband Tunneling", Applied Physics Letter 29 (2), Jul. 8, 1991.

R. Yang, "Infrared Laser Based on Intersubband Transitions in Quantum Wells", Superlattices and Microstructures, vol. 17, No. 1, 1995.

R. Yang, D. Zhang, C. Lin, C. Lin, S. Murry, S. Pei, High Power Mid–Infrared Interband Cascade Lasers Based on Type–II Quantum Wells, Appl. Physics Lett., 71 (17), Oct. 27, 1997.

J. Faist, F. Capasso, D. Sivco, C. Sirtori, A. Hutchinson, A. Cho. "Quantum Cascade Laser", Science, vol. 264, Apr. 22, 1994.

R. Kazarinov and R. Suris, "Possiblity of the Amplification of Electromagnetic Waves in a Semiconductor with a Superlattice", Soviet Physics—Semiconductors, vol. 5, No. 4, Oct., 1971.

R. Yang, and S. Pei, "Novel Type–II Quantum Cascade Lasers", J. Appl. Phys. 79 (11), Jun. 1, 1996.

\* cited by examiner

*Primary Examiner*—Paul Ip
*Assistant Examiner*—Davienne Monbleau
(74) *Attorney, Agent, or Firm*—Shaw Pittman LLP

(57) ABSTRACT

The present invention relates to quantum well semiconductor light emitting devices such as lasers and other devices that utilize type-II quantum wells and interband transitions of energy states between the conduction band and the valence band for light emission, resulting in significant improvement in radiative efficiency. The semiconductor light emitting devices comprise a multilayer semiconductor structure comprising a plurality of essentially identical active regions, each active region being separated from its adjoining active regions by an injection region that serves as the collector for the preceding active region and the emitter for the following active region. Each of said active regions comprises multiple quantum well regions or finite superlattice regions to improve carrier injection efficiency and enhance optical gain without using a large number of cascade stages. This can reduce the operating voltage and increase the power efficiency. Type-II tunnel junctions are utilized in the injection regions such that carriers can be reused through a spatial interband coupling after an interband transition for photon emission, leading to the realization of interband cascade configuration under an appropriate bias, which further improves the device performance.

20 Claims, 4 Drawing Sheets

PARALLEL CASCADE QUANTUM WELL LIGHT EMITTING DEVICE

The present application claims priority from the filing date of Provisional Patent Application Ser. No. 60/158,403 filed on Oct. 7, 1999.

BACKGROUND

1. Field of the Invention

The present invention relates to semiconductor light emitting devices and, more particularly, to quantum well semiconductor light emitting devices having improved carrier injection efficiency and power efficiency.

2. Background of the Invention

The emission wavelength of the semiconductor light emitting devices such as lasers developed to date is mainly in the near infrared (IR). This is limited by the band-gap of the semiconductor material in the active region where the stimulated recombination of electrons and holes across the band-gap results in the emission of electromagnetic radiation. Longer wavelength (>2 μm) semiconductor light sources are demanded by many military and civilian applications such as free-space communications, medical diagnostics, atmospheric pollution monitoring, industrial process control, IR countermeasures, and IR radar for aircraft and automobiles. There have been many attempts at developing long wavelength IR sources by employing intersubband transitions in artificial quantum well (QW) semiconductor heterostructures since an original proposal by Kazarinov et al. in Soviet Phys. Semicond. Vol. 5 (4), 1971. The wavelength of such an IR source due to intersubband transition is not determined by the band-gap, but is instead determined by the smaller energy separation of conduction subbands arising from quantum confinement in QW heterostructures made from relatively wide band-gap semiconductor materials. Therefore, the emission wavelength can be tailored over a wide spectral range from mid-IR to sub-millimeter by merely changing QW layer thickness. One recent development in such an intersubband light emitting device was reported by Faist et al. in Science, Vol. 264, pp. 553–556, Apr. 22, 1994, who demonstrated a quantum cascade (QC) laser. A distinct feature of the QC laser is that each electron is reused with the capability of generating an additional photon as it cascades down each step of the energy staircase. Alternatively, interband cascade (IC) lasers, utilizing optical transitions between the conduction and the valence bands in a staircase of Sb-based type-II QW structures as originally proposed by Yang in Superlattices and Microstructures, Vol. 17, pp. 77–83, 1995 and U.S. Pat. No. 5,588,015 (which is incorporated by reference herein in its entirety), represent another new class of semiconductor mid-IR light sources. The IC lasers have recently been demonstrated with encouraging results. See, for example, by Yang et al., "High power mid-infrared interband cascade lasers based on type-II quantum wells" published in Applied Physics Letters, Vol. 71, pp. 2409–2411, 1997. These lasers based on cascade configurations distinguish from the conventional bipolar semiconductor diode lasers in terms of equivalent circuit models. See, for instance, discussions in the paper published in J. Applied Physics, Vol. 79, pp. 8197–8203, 1996 by Yang et al. For a conventional bipolar diode laser consisting of several QWs in the active region for larger optical gain (or output power) and better optical confinement, each of the QWs can be viewed as light-emission units connected in parallel. On the other hand, the light-emission units in a cascade laser structure are connected in series. Ideally, as a consequence, current is traded for voltage in cascade laser structures. This means that the minimal bias voltage $V_0$ and minimal injection current $I_0$ required for a desired output power $P_o = I_0 V_0$ at a photon energy $E_p = h\nu$ are related to the cascade stages $N_c$ (equal to one for noncascade configurations) as expressed by $$V_0 = N_c \cdot V_p, \qquad (1)$$

$$I_0 = P_o / (N_c V_p), \qquad (2)$$

where $V_p = E_p/e$. In practice, the applied bias voltage $V$ and the total injection current $I$ would not exactly follow the relationship as indicated by Eqs. (1) and (2) because there is always an excess voltage $\Delta V$ and an excess current $\Delta I$ in devices. How the excess current and voltage affect the laser performance can be evaluated in terms of power conversion (wall-plug) efficiency $\eta = P_o/P_{in}$. Expressing the input power $P_{in}$ as, $$P_{in} = IV = (I_0 + \Delta I)(V_0 + \Delta V), \qquad (3)$$

we can obtain $$\eta^{-1} = 1 + \frac{\Delta I}{I_0} + \frac{\Delta V}{V_0} + \frac{\Delta I}{I_0} \cdot \frac{\Delta V}{V_0}. \qquad (4)$$

In an ideal case, $\Delta I = \Delta V = 0$, and $\eta = 1$; so no power is wasted. In practical cases where there are additional voltage drops due to parasitic resistances, leakage currents, and nonradiative processes, which result in non-negligible excess voltage $\Delta V$ and excess current $\Delta I$, there is always dissipated power $P_D = P_{in} - P_o = P_{in}(1-\eta)$. The resulting heat is detrimental to the operation of the device and limits the device performance. Therefore, it is especially important to maximize power efficiency. How this is done depends on the laser structure, approach, and materials. From Eq. (4), one finds that power efficiency is completely determined by the normalized excess current $\Delta I/I_0$ and voltage $\Delta V/V_0$ in equal weight, which are more appropriate than $\Delta I$ and $\Delta V$ for describing device performance. As discussed by Yang, "Mid-infrared interband cascade lasers based on type-II heterostructures," Microelectronics Journal, Vol. 30, No. 10, pp. 1043–1056 (1999) (attached hereto in the Appendix) and implied in Eq. (2), the normalized excess current $\Delta I/I_0$ could be relatively large in a cascade structure for mid-IR lasers with many cascade stages, though its $\Delta V/V_0$ can be small. One the other hand, the normalized excess current $\Delta I/I_0$ could be relatively small in a conventional parallel structure for mid-IR lasers, but with a large $\Delta V/V_0$. Therefore, power efficiency could be practically limited due to either relatively large $\Delta I/I_0$ or $\Delta V/V_0$ in both configurations for mid-IR lasers. Quantum well semiconductor superlattice structures are also discussed in R. Q. Yang, Chapter 2 in "LONG WAVELENGTH INFRARED EMITTER BASED ON QUANTUM WELLS AND SUPERLATTICES," (M. Helm, ed., Gordon and Breach Science), entitled "Novel Concepts and Structures for Infrared Lasers" (attached hereto in the Appendix). Interband cascade lasers are discussed in R. Q. Yang et al., "Interband cascade lasers: progress and challenges," Physica E, pp. 69–75 (2000), attached hereto in the Appendix.

SUMMARY OF THE INVENTION

The present invention is a semiconductor light emitting device comprising a multilayer semiconductor structure having a plurality of essentially identical active regions. The active regions are separated from their adjoining active regions by an injection region that serves as the collector for the preceding active region and as the emitter for the following active region. Carriers undergo interband transitions of energy states between the conduction band and the valence band in said active regions, resulting in light emission. Each of said active regions comprises multiple quantum well regions or finite superlattice regions to improve carrier injection efficiency and enhance optical gain without using a large number of cascade stages. This can reduce the operating voltage and increase the power efficiency.

The injection region comprises n-type and p-type semiconductor regions to form a type-II tunnel junction. In such a way, carriers are facilitated through interband tunneling for sequential photon emission under an appropriate bias, leading to the realization of an interband cascade configuration, which further improves the device performance.

The light emitting devices of the present invention utilize interband transitions of energy states between the conduction and valence bands in multiple quantum wells or superlattices, which differ from the intersubband or interminiband quantum cascade lasers as described by Capasso, et al. in U.S. Pat. Nos. 5,457,709 and 5,936,989. Compared to the structures disclosed in U.S. Pat. No. 5,588,015, the multiple quantum well (or superlattice) active region contained in each cascade stage in the present invention can have significant optical gain despite using a lesser number of cascade stages, leading to improved power efficiency.

BRIEF DESCRIPTION OF THE DRAWINGS

The present invention, as exemplified by a preferred embodiment, is described with reference to the drawings as follows.

DETAILED DESCRIPTION OF THE INVENTION

Figure 1:
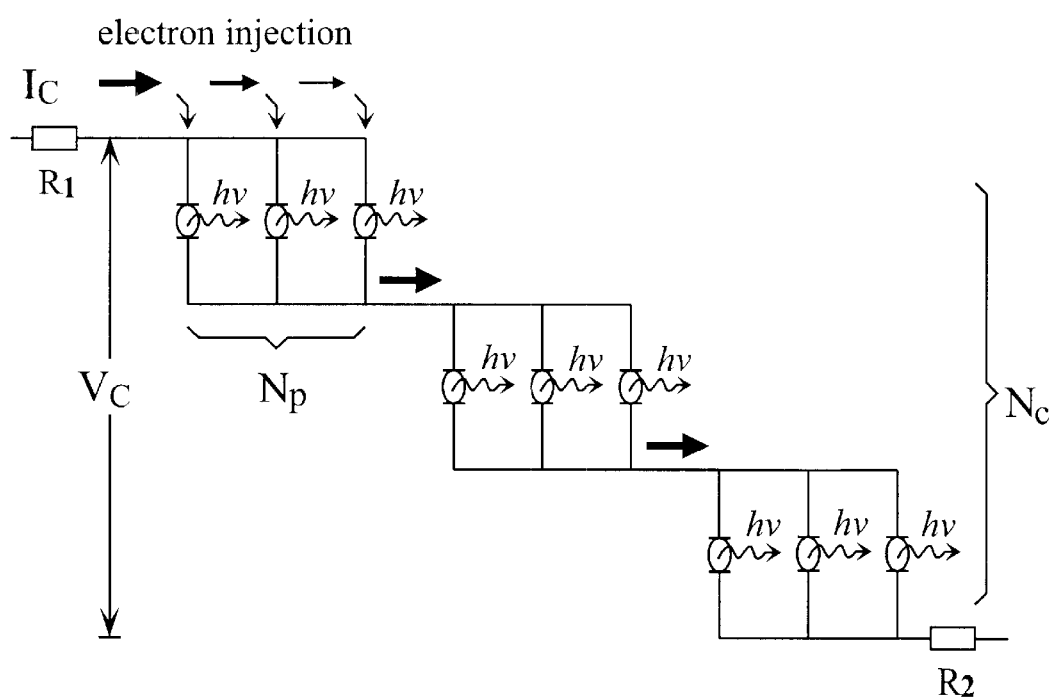
FIG. 1 schematically depicts a portion of an equivalent circuit of an exemplary parallel cascade configuration comprising multiple interband light emitting units in each period, according to the present invention.

Referring to the drawings, FIG. 1 schematically illustrates an equivalent circuit for an exemplary parallel cascade light-emitting device useful in explaining the general principle of the present invention. The parallel cascade light-emitting device illustrated in FIG. 1 comprises multiple (say, $N_C$) cascade stages (only three stages are shown in FIG. 1; the typical number of stages ranges from 3 to 15 depending on the emission wavelength and other factors). Each cascade stage comprises multiple QWs (say, $N_P$, only three units are shown in FIG. 1; the typical number of QWs ranges from 3 to 10) or superlattice light-emitting units. In FIG. 1, $V_C$ denotes the bias voltage across the all cascade stages. The equivalent circuit for this parallel cascade light-emitting device can be viewed as a combination of parallel-connection and series-connection, which allows both larger $I_0$ with smaller $\Delta I/I_0$ in contrast to a simple cascade structure, and higher $V_0$ with lower $\Delta V/V_0$ in comparison to a conventional parallel structure. Such a marriage of cascade and conventional parallel structures, as illustrated in FIG. 1, provides an additional degree of freedom to manipulate the number of cascade stages ($N_C$) and the number of light-emission units ($N_P$) in each stage so that both $\Delta V/V_0$ and $\Delta I/I_0$ can be optimized to be small for achieving maximum power efficiency at a desired output power. It is expected that for an optimized mid-IR (3–5 microns) laser based on this parallel cascade structure $\Delta V/V_0$ and $\Delta I/I_0$ can be smaller than 0.5 and 2, respectively, resulting in a power efficiency near 30% or better with an output power of watt level at temperatures above 77 K. Also, multiple QWs contained in each cascade stage could reduce the percentage of leakage via increased capture of carriers, leading to improved injection efficiency.

A preferred embodiment of the present invention uses two types of QW systems, type-I QW and type-II QW, as well as interband transitions associated with them. However, a type-I QW system is made of heterostructures such as GaAs/AlGaAs or InGaAs/InAlAs/InP, where the small band-gap material has both its electron and hole levels confined by the larger band-gap materials. A type-II QW is composed of heterostructure such as InAs/Ga(In)Sb, where the valence band-edge of one material (e.g. GaInSb) is higher in energy than the conduction band-edge of the other material (e.g. InAs), so that electrons and holes are mainly confined in the different layers. A type-II interband transition is such that wave-functions for two transition states between the conduction and valence bands are mainly centered in different layers. In contrast, a type-I interband transition is such that wave-functions for two transition states between the conduction and valence bands are mainly centered in the same layer associated with the type-I QW. The preferred embodiment of present invention involves two types of tunnel junctions, type-I and type-II tunnel junctions. A type-I tunnel junction is such that the conduction band-edge of the emitter is higher in energy than the conduction band-edge of the collector. In addition, a type-I tunnel junction is formed with the conduction band-edge of the collector higher in energy than the valence band-edge of the emitter. In contrast, in type-II tunnel junctions, the valence band-edge of the emitter is higher in energy than the conduction band-edge of the collector or alternatively the conduction band edge of the emitter is lower in energy than the valence band-edge of the collector. For example, a type-II tunnel junction can be formed with InAs/AlSb/GaSb heterostructure, in which AlSb layer is served as a tunnel barrier. Those skilled in the art will appreciate that the definitions of type-I and type-II tunnel junctions include the case in which the barrier layer thickness between the emitter and the collector is zero.

Figure 2:
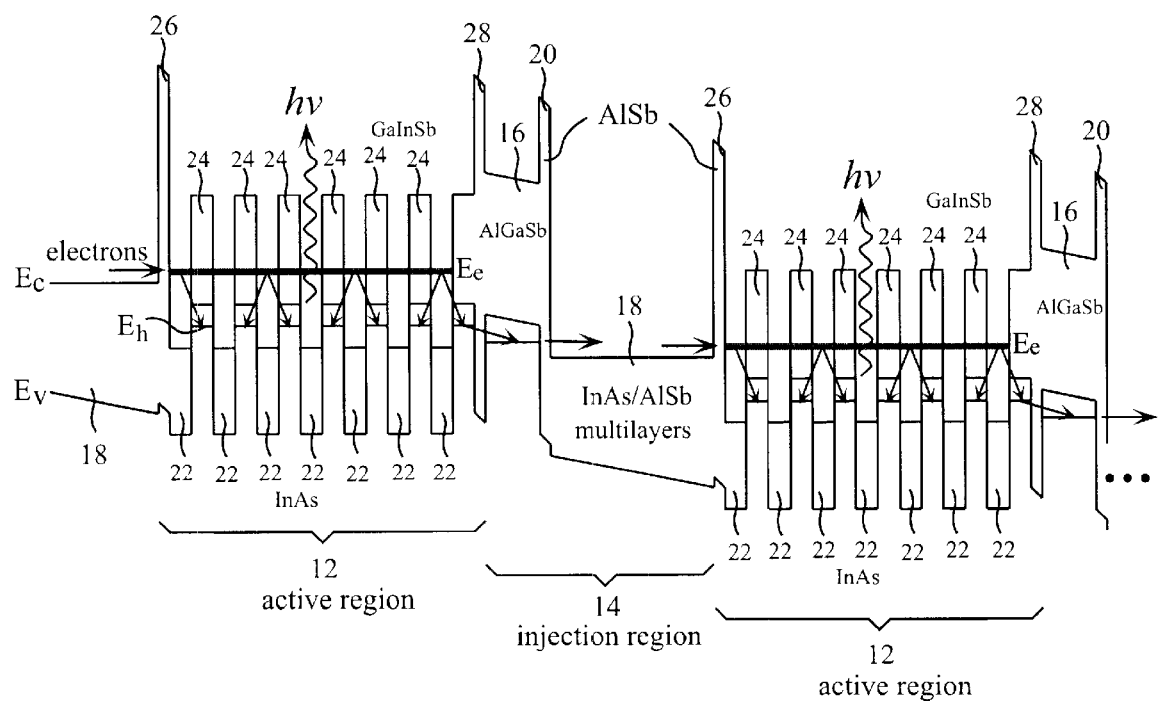
FIG. 2 schematically depicts a portion of the energy band profile of an exemplary parallel cascade light emitting device based on type-II interband transition in a forward biased state, according to the present invention.

A preferable example of such a parallel cascade light-emitting device based on type-II interband transition in a Sb-family staircase QW structure is illustrated in FIG. 2. The device comprises a plurality of essentially identical active regions 12. Each active region 12 is connected in series by injection regions 14 that serve as the collector for the proceeding active region 12 and the emitter for the following active region 12. The injection region is comprised of p-type semiconductor region 16 and n-type semiconductor region 18. For the exemplary interband cascade light emitting device in FIG. 2, an n-type semiconductor region 18 can be comprised of either an analog graded quaternary AlInAsSb alloy layer or digitally graded gap region comprising a multiplicity of InAs/Al(In)Sb layers, a p-type semiconductor region 16 can be comprised of either an analog graded ternary AlGaSb alloy layer or digitally graded gap region comprising multiplicity of AlSb/GaInSb layers. The p-type semiconductor region 16, the tunnel barrier 20 and the n-type semiconductor region 18 form the type-II tunnel junction such that electrons can be reused through a spatial interband coupling after an interband transition for photon emission, leading to the realization of interband cascade configuration under an appropriate bias. Barrier layers 20 in the injection regions can vary in thickness, but should be thin enough so that carriers can tunnel through the layers.

The active region 12 comprises a plurality of spatially coupled type-II QWs made of semiconductor layers 22 and 24, where type-II interband transitions occur resulting in photon emission. In FIG. 2, the active region also includes barrier layers 26 and 28 disposed adjacent to the injection regions to form type-I tunnel junctions. The type-II QW layers 22 and 24 can be made of semiconductors InAs and GaInSb (e.g., 3.1 nm thick InAs layer and 2 nm thick $Ga_{0.85}In_{0.15}Sb$ layer), respectively, and the barrier layers 26 and 28 can be made of semiconductor AlSb (typical of 1.2 to 2.3 nm thick). As shown in FIG. 2, at least one ground energy state $E_e$ is formed in the conduction band of the active region 12 and one ground energy state $E_h$ which is lower than $E_e$ in energy is formed in the valence band of the active region 12. In the case as illustrated in FIG. 2, energy state $E_e$ can be regarded as a miniband state with a strong coupling between type-II QWs in the conduction band, and energy state $E_h$ can approximately be regarded as a degenerate state due to relatively weak spatial coupling in the valence band. The energy state $E_e$ resides in the band-gap of the p-type semiconductor region 16 in the following injection region 14, and the energy state $E_h$ resides in the band-gap of n-type semiconductor region 18 in the preceding injection region 14. Under a forward bias, the whole band-edge diagram of the device looks like an energy staircase, in which electrons are reused, leading to sequential photon emission, as they cascade through each period of the active region. The operation of this parallel cascade light-emitting device is similar to the device operation disclosed in U.S. Pat. No. 5,588,015.

FIG. 2 illustrates an exemplary parallel cascade light emitting interband device in a nearly lattice-matched InAs/AlSb/GaSb type-II QW system. The emission wavelength in such a parallel cascade interband light-emitting device for type-II InAs/AlSb/GaSb QW system is determined by the energy separation between the two interband transition states in the active region and can be entirely tailored by adjusting the InAs and GaInSb QW layer thicknesses, over a wide spectral range from the mid-IR to the far-IR region (i.e., ~2 µm to ~100 µm). The short wavelength cutoff (~2 µm) is limited by the conduction band-offset between InAs and GaInSb. However, a shorter wavelength in the near IR spectrum including the important 1.3 µm and 1.55 µm for optical fiber communication can be realized by using a wider band-gap material AlGaSb (e.g., $Al_{0.2}Ga_{0.8}Sb$) instead of GaInSb.

A preferred embodiment of the invention has been described above, in which the active regions 12 are made of type-II QWs. However, without departing from the spirit of the invention, several variations of the interband cascade light emitting device structure can be made possible with active regions comprised of type-I QWs where type-I interband transition is responsible for photon emission. In one embodiment, a parallel cascade structure based on a type-I interband transition is shown in FIG. 3, where the active region 12 can be composed of multiple coupled GaInAsSb/AlInSb QWs for layers 22 and 24, respectively.

The interband cascade light emitting devices can be manufactured by any known processes for creating semiconductor devices, such as the growth of epitaxial layers on a substrate. One of the most widely used and versatile techniques for growing epitaxial layers is molecular beam epitaxy (MBE).

Figure 3:
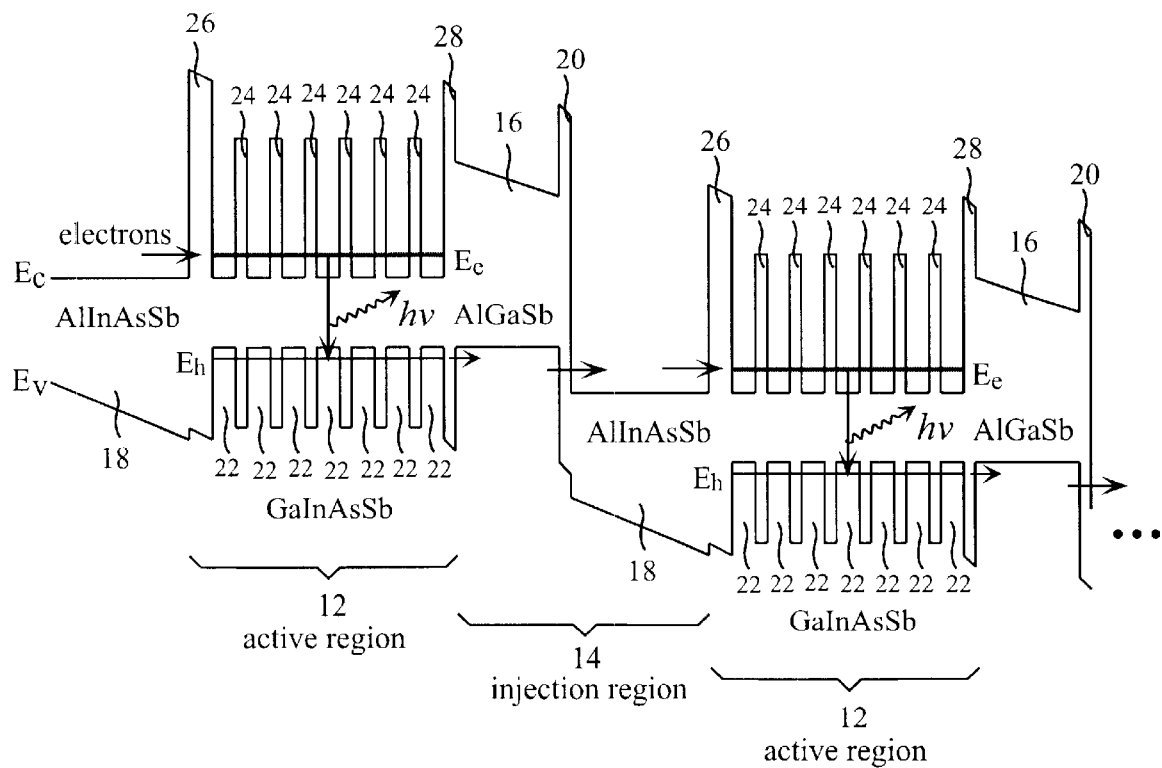
FIG. 3 schematically depicts a portion of the energy band profile of an exemplary parallel cascade light emitting device based on type-I interband transition in a forward biased state, according to the present invention.
Figure 4:
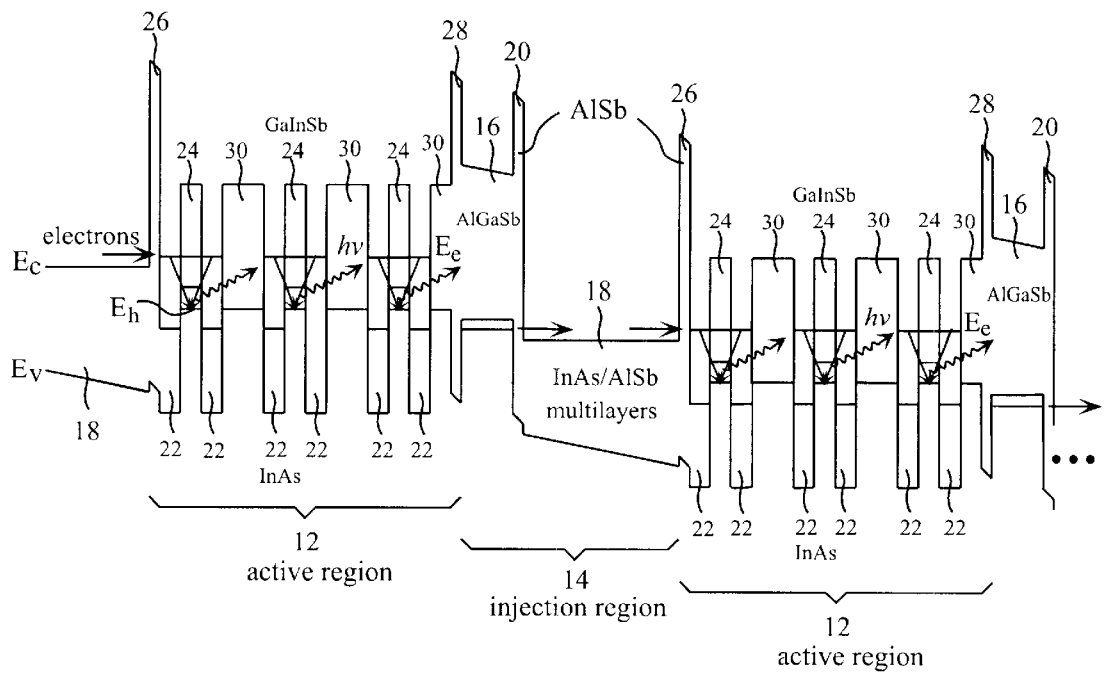
FIG. 4 schematically depicts a portion of the energy band profile of an exemplary parallel cascade light emitting device based on interband transition in complex type-II QW structures under a forward bias, according to the present invention.

Preferred embodiments of the invention have been shown in FIG. 2 and FIG. 3 based on the active region that comprises relatively strong-coupled multi-QWs or finite superlattices. However, without departing from the spirit of the invention, it should be understood by those skilled in the art that barrier layers could be inserted into various positions in every active region to form a variety of coupled and/or relatively discrete QW light-emitting units in every cascade stage. Those barrier layers in the active regions can vary in thickness and composition to manipulate carrier distribution and coupling strength between light-emitting units. One example with such complex type-II QWs is illustrated in FIG. 4, where barrier layers 30 are inserted in the active regions and can be made of AlGaSbAs semiconductor alloy. The thicknesses and compositions of the AlGaSbAs layer should be selected to make the entire active region (or period) strain-balanced and latticed-matched to the substrate on which the QW structure is grown. A typical AlGaSbAs layer thickness ranges from 3 to 7 nm.

The present invention combining the advantages of interband cascade and conventional laser structures should provide additional degrees of freedom for optimizing laser performance. The other benefit of the parallel cascade is the tolerance towards the longer injection region without sacrificing much of the active filling factor (ratio between the active region length and the total period) such that the electric field can be safely lower than the dielectric breakdown threshold of materials used in lasers.

The present invention has been specifically described and illustrated with respect to preferred embodiments and specific example for purposes of illustration and description. It is not intended to be exhaustive or to limit the invention to the precise forms disclosed. Many variations and modifications of the embodiments described herein will be obvious to one of ordinary skill in the art in light of the above disclosure. It should be understood that such variations and modifications may be made to the embodiments and examples disclosed herein without departing from the spirit and scope of the invention. The scope of the invention is to be defined only by the claims appended hereto, and by their equivalents.

What is claimed is:

1. A light emitting device comprising a plurality of essentially identical repeat units stacked in series to produce cascade photon emission under appropriate bias, each repeat unit comprising an active region and an injection region, wherein said injection region comprises semiconductor regions selected to form a type-II tunnel junction between adjacent active regions so as to facilitate carriers for cascaded interband transitions;

said active region has at least one energy state in its conduction band and at least one energy state in its valence band, the energy state in the valence band being lower in energy than the energy state in the conduction band, such that carrier transition from the energy state in the valence band results in emission of a photon of wavelength λ, the active region comprises a plurality of spatially coupled type-II quantum well regions where type-II interband transitions occur resulting in photon emission, and where said active region comprises a plurality of quantum well levels in the valence band, and the injection region comprises n-type and p-type semiconductor regions to form a type-II tunnel junction to facilitate interband tunneling.

2. The device of claim 1, wherein said type-II quantum well regions comprise semiconductor barrier layers selected from the group consisting of AlSb, AlInSb, AlGaSb, AlSbAs, AlGaSbAs.

3. The device of claim 1, wherein said type-II quantum well regions comprise semiconductor layers selected from the group consisting of InAs/GaSb, InAs/GaInSb, InAsSb/GaInSb, InGaAs/GaInSb, InAs/GaInSb/InAs, InAs, InAsSb, InGaAs, InGaAsSb, GaSb, GaInSb, AlGaSb, AlGaInSb.

4. The device of claim 3, wherein said type-II quantum well regions further comprise semiconductor barrier layers selected from the group consisting of AlSb, AlInSb, AlGaSb, AlSbAs, AlGaSbAs.

5. The device of claim 1, wherein said n-type semiconductor region comprises one of an analog graded InAlAsSb alloy layer and a first digitally graded superlattice selected from the group consisting of InAs/AlSb, InAsSb/AlSb, InAs/AlInSb, InAsSb/AlInSb, InGaAs/AlInSb, and wherein said p-type semiconductor region comprises one of an analog graded AlGaSb alloy layer and a second digitally graded superlattice selected from the group consisting of GaSb/AlSb, InGaSb/AlSb, InGaSb/AlSbAs, GaSb/AlSbAs, AlGaSb/AlSb.

6. A light-emitting device comprising a plurality of essentially identical repeat units stacked in series to produce cascade photon emission under appropriate bias, a given repeat unit comprising an active region and an injection region, wherein said injection region comprising semiconductor materials selected to form a type-II tunnel junction between adjacent active regions so as to facilitate carriers for cascaded interband transitions, said active region having at least one energy state residing in its conduction band and having at least one energy state in its valence band, the energy state in the valence band being lower in energy than the energy state in the conduction band, such that a carrier transition from the energy state in the conduction band to the energy state in the valence band results in emission of a photon of wavelength $\lambda$, where the active region comprises a plurality of spatially-coupled type-I quantum well regions where type-I interband transitions occur resulting in photon emission; and where said active region comprises a plurality of quantum well levels in the valence band, and the injection region comprises n-type and p-type semiconductor regions to form type-II tunnel junctions, and further comprising a tunnel barrier disposed between said n-type semiconductor region and said p-type semiconductor region, said barrier being sufficiently thin to permit carrier tunneling.

7. The device of claim 6, wherein said type-I quantum well regions comprise semiconductor layers selected from the group consisting of GaSb/AlSb, GaInSb/AlSb, GaInAsSb/AlInSb.

8. The device of claim 6, wherein said barrier is a semiconductor layer selected from the group consisting of AlSb, AlInSb, AlSbAs, and AlGaSbAs.

9. The device of claim 6, wherein said n-type semiconductor region comprises one of an analog graded InAlAsSb alloy layer and a first digitally graded superlattice selected from the group consisting of InAs/AlSb, InAsSb/AlSb, InAs/AlInSb, InAsSb/AlInSb, InGaAs/AlInSb, wherein said p-type semiconductor region comprises either an analog graded AlGaSb alloy layer or a second digitally graded superlattice selected from the group consisting of GaSb/AlSb, InGaSb/AlSb, InGaSb/AlSbAs, GaSb/AlSbAs, AlGaSb/AlSb.

10. A semiconductor light emitting device comprising:

(a) a plurality of essentially identical active regions, each such region comprising a plurality of spatially-coupled type-II quantum wells where said active regions comprise a plurality of quantum well levels in the valence band, (b) first barrier regions adjacent to each of the active regions on a first side of the active region;

(c) second barrier regions adjacent to each of the active regions on a second side of the active region; and (d) injection regions between the active regions,
wherein the injection regions form type-II tunnel junctions between their adjacent active regions, and
wherein type-II interband transitions occur in the active regions resulting in photon emissions.

11. The device of claim 10, wherein the barrier regions are formed from AlSb.

12. The device of claim 10, wherein the active regions are formed from alternate layers of InAs and GaInSb.

13. The device of claim 10, wherein the injection regions comprise a p-type layer and an n-type layer.

14. The device of claim 13, wherein the p-type layer of the injection region is one of an analog graded ternary alloy and a digitally graded region formed from a plurality of layers.

15. The device of claim 14, wherein the p-type layer is an AlGaSb layer.

16. The device of claim 14, wherein the p-type layer is formed from a multiplicity of AlSb/GaInSb layers.

17. The device of claim 13, wherein the n-type layer is one of an analog graded quaternary alloy layer and a digitally graded region formed from a plurality of layers.

18. The device of claim 17, wherein the n-type layer is an AlInAsSb alloy.

19. The device of claim 17, wherein the n-type layer is formed from a multiplicity of InAs/Al(In)Sb layers.

20. The device of claim 10, wherein the photon emissions range from the mid-IR to the far-IR.

* * * * *